United States Patent
Choi

[11] Patent Number: 6,080,524
[45] Date of Patent: Jun. 27, 2000

[54] PHOTOSENSITIVE POLYMER HAVING CYCLIC BACKBONE AND RESIST COMPOSITION COMPRISING THE SAME

[75] Inventor: Sang-jun Choi, Seoul, Rep. of Korea

[73] Assignee: Samsung Electronics Co., Ltd., Suwon, Rep. of Korea

[21] Appl. No.: 09/251,158

[22] Filed: Feb. 17, 1999

[30] Foreign Application Priority Data

Jun. 2, 1998 [KR] Rep. of Korea ............. 98-20395

[51] Int. Cl.$^7$ .................................. G03F 7/004
[52] U.S. Cl. ..................... 430/270.1; 430/905; 430/910
[58] Field of Search ....................... 430/270.1, 910, 430/905

[56] References Cited

U.S. PATENT DOCUMENTS

| | | | |
|---|---|---|---|
| 5,879,857 | 3/1999 | Chandross et al. | 430/270.1 |
| 5,962,191 | 10/1999 | Nozaki et al. | 430/287.1 |
| 5,981,142 | 11/1999 | Jung et al. | 430/270.1 |

*Primary Examiner*—John S. Chu
*Attorney, Agent, or Firm*—Jones Volentine, LLP

[57] ABSTRACT

A photoresist composition including a photoacid generator and a photosensitive polymer for use in a chemically amplified photoresist that is represented by the following chemical formula (CF1):

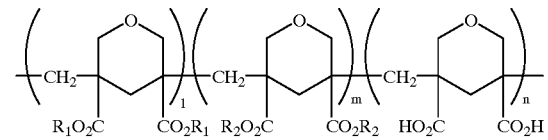

wherein $R_1$ is a $C_1$ to $C_{20}$ aliphatic hydrocarbon; $R_2$ is selected from the group including t-butyl, tetrahydropyranyl and 1-alkoxyethyl groups; l, m, and n are integers, and wherein $l/(l+m+n)=0.1–0.5$, $m/(l+m+n)=0.1–0.7$, and $n/(l+m+n)=0.0–0.4$. The photosensitive polymer has a cyclic backbone containing an alicyclic compound, which has high resistance to dry etching, and is used with excimer lasers to create a fine pattern line.

13 Claims, No Drawings

PHOTOSENSITIVE POLYMER HAVING CYCLIC BACKBONE AND RESIST COMPOSITION COMPRISING THE SAME

BACKGROUND OF THE INVENTION

1. Field of the Invention

The present invention relates to a chemically amplified photoresist composition. The invention further relates to a photosensitive polymer to be used in the photoresist composition, which polymer has a backbone structure containing an alicyclic compound that increases the resistance of the photoresist composition to dry etching. The photoresist compositions of the present invention are suitable for use with an ArF excimer laser.

2. Description of the Related Art

Current semiconductor devices are highly integrated and complicated to manufacture, requiring a very fine resist pattern. Further, as the capacity of a semiconductor device increases to exceed 1 Gbit, a pattern size having a design rule less than 0.2 μm is required. Accordingly, there are limitations to using conventional photoresists that are developed with a KrF excimer laser (248 nm). Thus, a new photoresist material capable of being developed by an ArF excimer laser (193 nm) has been produced for use in a photolithography process.

Methacrylate polymers are generally used as the resist material in photolithography processes for use with the ArF excimer laser. However, such polymers have a very weak resistance to dry etching. To increase resistance to dry etching, a polymer having a backbone composed of an alicyclic compound such as an isobonyl group, an adamantyl group or a tricyclodecanyl group is used. These conventional polymers, however still exhibit weak resistance to dry etching.

SUMMARY OF THE INVENTION

It is therefore an objective of the present invention to provide a photosensitive polymer having a backbone with a cyclic structure containing an alicyclic compound that significantly the increases resistance of the photoresist composition to dry etching.

It is another objective of the present invention to provide a photoresist composition containing the photosensitive polymer that is suitable for use in a photolithography process that uses an ArF excimer laser.

To achieve the first objective, the present invention provides a photosensitive polymer represented by the following chemical formula (CF1):

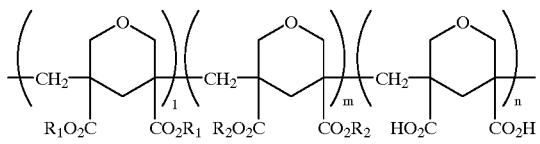

wherein $R_1$ is a $C_1$ to $C_{20}$ aliphatic hydrocarbon; $R_2$ is selected from the group comprising t-butyl, tetrahydropyranyl and 1-alkoxyethyl groups; l, m, and n are integers, and wherein $l/(l+m+n)=0.1–0.5$, $m/(l+m+n)=0.1–0.7$, and $n/(l+m+n)=0.0–0.4$.

The polymer of the present invention has a weight-average molecular weight of from 3,000 to 100,000. In a preferred embodiment, $R_1$ is a $C_7$ to $C_{20}$ alicyclic aliphatic hydrocarbon.

To achieve the second objective, the present invention provides a photoresist composition having (a) a photosensitive polymer that is represented by the following chemical formula (CF1):

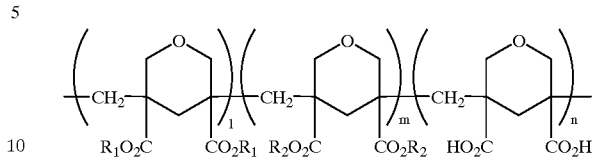

wherein $R_1$ is a $C_1$ to $C_{20}$ aliphatic hydrocarbon; $R_2$ is selected from the group comprising t-butyl, tetrahydropyranyl and 1-alkoxyethyl groups; l, m, and n are integers, and wherein $l/(l+m+n)=0.1–0.5$, $m/(l+m+n)=0.1–0.7$, and $n/(l+m+n)=0.0–0.4$; and (b) a photoacid generator (PAG).

The photoresist composition comprises a photoacid generator in an amount of 1 weight percent to 15 weight percent of the photoacid generator based on the weight of the polymer.

In a preferred embodiment, the PAG is one selected from the group comprising triarylsulfonium salts, diaryliodonium salts, sulfonates, and mixtures thereof.

In another preferred embodiment, the PAG is one selected from the group comprising triphenylsulfonium triflate, triphenylsulfonium antimonate, diphenyliodonium triflate, diphenyliodonium antimonate, methoxydiphenyliodonium triflate, di-t-butyldiphenyliodonium triflate, 2,6-dinitrobenzyl sulfonates, pyrogallol tris(alkylsulfonates), N-hydroxy succinimide triflate, and mixtures thereof.

The photoresist composition further comprises an organic base in an amount of from 0.01 weight percent to 2.0 weight percent based on the weight of the polymer. The organic base is preferably one selected from the group comprising triethyl amine, triisobutylamine, triisooctylamine, and mixtures thereof. In still another embodiment, the organic base is one selected from the group comprising diethanol amine, triethanol amine, and mixtures thereof.

Another embodiment according to the present invention provides a photosensitive polymer whose backbone has a cyclic structure and contains an alicyclic compound. The photosensitive polymers of the present invention provide a high resistance to dry etching and confer excellent photolithographic qualities on the photoresist compositions of the present invention which include the polymer.

DESCRIPTION OF THE PREFERRED EMBODIMENTS

The preferred embodiments of the present invention will now be described. In general, the present invention provides a photosensitive polymer represented by the following chemical formula (CF1):

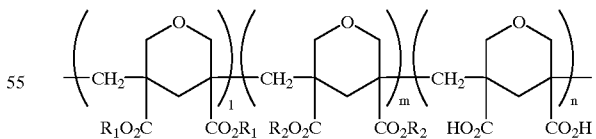

wherein $R_1$ is a $C_1$ to $C_{20}$ aliphatic hydrocarbon; $R_2$ is selected from the group comprising t-butyl, tetrahydropyranyl and 1-alkoxyethyl groups; l, m, and n are integers, and wherein $l/(l+m+n)=0.1–0.5$, $m/(l+m+n)=0.1–0.7$, and $n/(l+m+n)=0.0–0.4$.

The polymer of the present invention has a weight-average molecular weight of from 3,000 to 100,000. In a preferred embodiment, $R_1$ is a $C_7$ to $C_{20}$ alicyclic aliphatic hydrocarbon.

The present invention also provides a photoresist composition which is obtained by combining the photosensitive polymer represented by (CF1) and a photoacid generator (PAG). The photoresist composition comprises the photoacid generator in an amount of 1 weight percent to 15 weight percent of the photoacid generator based on the weight of the polymer. The PAG is one selected from the group comprising triarylsulfonium salts, diaryliodonium salts, sulfonates, and mixtures thereof.

In another embodiment, the PAG may be one selected from the group comprising triphenylsulfonium triflate, triphenylsulfonium antimonate, diphenyliodonium triflate, diphenyliodonium antimonate, methoxydiphenyliodonium triflate, di-t-butyldiphenyliodonium triflate, 2,6-dinitrobenzyl sulfonates, pyrogallol tris(alkylsulfonates), N-hydroxy succinimide triflate, and mixtures thereof.

The photoresist composition further comprises an organic base in an amount of from 0.01 weight percent to 2.0 weight percent based on the weight of the polymer. The organic base is preferably one selected from the group comprising triethyl amine, triisobutylamine, triisooctylamine, and mixtures thereof. In another embodiment, the organic base is one selected from the group comprising diethanol amine, triethanol amine, and mixtures thereof.

The present invention thus provides a photosensitive polymer whose backbone has a cyclic structure and contains an alicyclic compound, which provides a high resistance to dry etching and excellent photolithographic qualities.

The embodiments of the present invention will now be described in greater detail with reference to the following examples.

EXAMPLE 1

Synthesis of the ether dimer of aadamantyl hydroxymethylacrylate

The synthesis reaction of the ether dimer of adamantyl hydroxymethylacrylate is represented by the following reaction formula

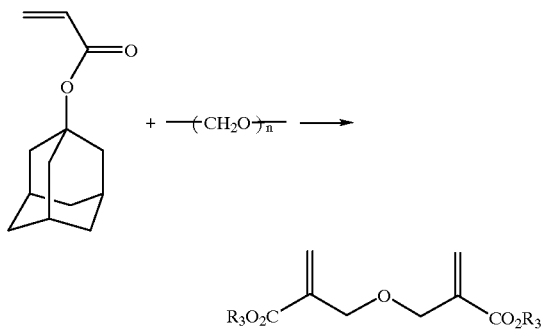

wherein $R_3$ is adamantyl.

62 g of adamantyl acrylate (ADA) (0.3 mol), 9.0 g of paraformaldehyde (PFA) (0.3 mol) and 4.5 g of 1,4-diazabicyclo[2,2,2]octane (DABCO) were mixed together and 18.0 g of tert-butanol was then added to the mixture. The mixture was next reacted at a temperature of 85° C. for about 6 days.

After the reaction was complete, the product was poured into an excess amount of methanol to be precipitated, and the mixture was stirred for 6 hours. Thereafter, the precipitate produced by the reaction was filtered and dried to recover the desired product (yield: 32 g).

The result of nuclear magnetic resonance (NMR) analysis performed on the obtained product is as follows:

$^1$H-NMR (CDCl$_3$, ppm): 6.2(s, 1H), 5.8(s, 1H), 4.2(s, 1H), 2.2(s, 9H), 1.7(s, 6H)

EXAMPLE 2

Synthesis of the ether dimer of tert-butyl hydroxymethylacrylate 77 g of tert-butyl acrylate (0.6 mol), 18 g of paraformaldehyde (PFA) (0.3 mol) and 9.0 g of 1,4-diazabicyclo[2,2,2]octane (DABCO) were mixed together before adding 36.0 g of tert-butanol. The mixture was then reacted at a temperature of 85° C. for about 6 days.

After the reaction was complete, the product was poured into an excess amount of methanol, neutralized using HCl and extracted using diethyl ether. Thereafter, the desired product was separated from the extracted material using column chromatography (hexane:diethyl ether=9:1) (yield: 49 g).

The results of nuclear magnetic resonance (NMR) analysis and Fourier Transform Infrared (FT-IR) analysis performed on the distilled material, the ether dimer of tert-butyl hydroxymethylacrylate, are as follows:

$^{13}$C-NMR (CDCl$_3$, ppm): 26.7(CH$_3$), 67.8(CH$_2$O), 78.7 (OC(CH$_3$)$_3$), 122.3(=CH$_2$), 138.0 (C=CH$_2$) and 163.0 (CO$_2$R)

FT-IR(NaCl, cm$^{-1}$):

2979(C—H, t-butyl), 1710(C=O, ester), 1639 (C=H, vinyl), 1369, 1154

EXAMPLE 3

Synthesis of the ether dimer of hydroxymethyl acrylic acid

The ether dimer synthesized in Example 2 was mixed with excess trifluoroacetic acid and reacted at room temperature for about 24 hours. The resultant precipitate was then extracted, washed with diethyl ether and dried to recover the product (yield 95%).

EXAMPLE 4

Synthesis of the homopolymer of ether dimer of tert-butyl hydroxymethylacrylate

The synthesis reaction of a homopolymer can be represented by the following reaction formula (RF2):

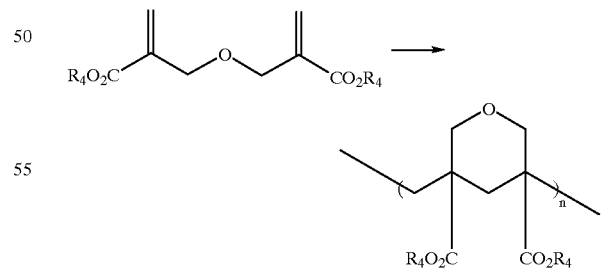

wherein $R_4$ is a tert-butyl.

3 g of the ether dimer (10 mmol) synthesized in Example 2 (i.e., Bis(t-butyl acrylmethyl)ether) and 0.07 g of azobis (isobutyronitrile) (AIBN) were dissolved in 27 ml of anhydrous benzene, and then purged for about 2 hours using N$_2$ gas. The obtained product was then polymerized at a temperature of 60° C. for about 48 hours.

After the polymerization was complete, the product was slowly dropped into an excess amount of methanol to be precipitated. The precipitated material was then dried in a vacuum oven maintained at about 50° C. for about 24 hours.

The weight-average molecular weight and polydispersity of the obtained product were 14,600 and 2.1, respectively.

EXAMPLE 5

Synthesis of the copolymer of ether dimer

The synthesis reaction of a copolymer can be represented by the following reaction formula (RF3):

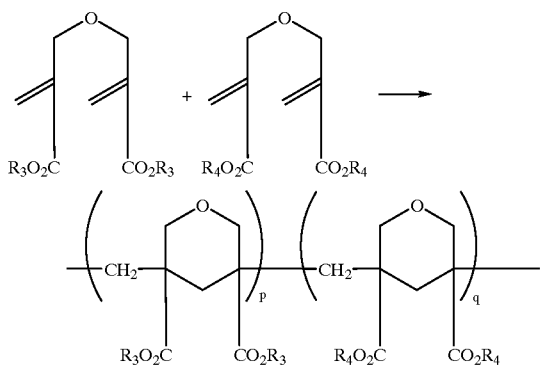

wherein $R_3$ is adamantyl and $R_4$ is tert-butyl.

4.5 g of the ether dimer (10 mmol) synthesized in Example 1, 3.0 g of the ether dimer (10 mmol) synthesized in Example 2, and 0.14 g of AIBN were dissolved in 60 ml of anhydrous benzene, and purged for about 2 hours using $N_2$ gas. Then, the obtained product was polymerized at a temperature of 60° C. for about 24 hours.

After the polymerization reaction was complete, the product was slowly dropped into an excess amount of methanol to be precipitated.

The obtained precipitated material was then dried in a vacuum oven maintained at a temperature of 50° C. for about 24 hours. The weight-average molecular weight and polydispersity of the obtained material were 12,400 and 2.2, respectively.

EXAMPLE 6

Synthesis of terpolymer of ether dimer

The synthesis reaction of a terpolymer can be represented by the following reaction formula (RF4):

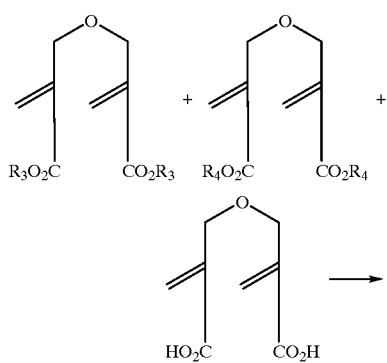

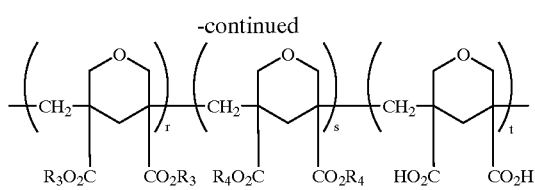

wherein $R_3$ is adamantyl and $R_4$ is tert-butyl.

9.0 g of the ether dimer (20 mmol) synthesized in Example 1, 6.0 g of the ether dimer (20 mmol) synthesized in Example 2, 1.9 g of the ether dimer (10 mmol) synthesized in Example 3, and 0.33 g of AIBN were dissolved in 200 ml of tetrahydrofuran, and purged for about 2 hours using $N_2$ gas. The obtained product was then polymerized for about 24 hours in a reflux condition.

After the polymerization was complete, the product was slowly dropped into excess n-hexane to be precipitated. The precipitate was then dried in a vacuum oven maintained at a temperature of 50° C. for about 24 hours.

The weight-average molecular weight and polydispersity of the obtained material were 15,800 and 2.4, respectively.

EXAMPLE 7

Photolithographic Performance 1.0 g of the copolymer synthesized in Example 5, (wherein q/(p+q)=0.6 and weight-average molecular weight=11,500), and 0.02 g of triphenyl sulfonium triflate as a photoacid generator, were completely dissolved in 6.0 g of propylene glycol monomethyl ether acetate (PGMEA). The solution was then filtered using a 0.2 μm membrane filter to obtain a resist composition. Next, the resist composition was applied to a silicon wafer treated with hexamethyldisilazane (HMDS) to form a coating film having a thickness of about 0.5 μm on the wafer.

The wafer having the coated photoresist film thereon was then pre-baked at a temperature of about 140° C. for about 90 seconds and exposed to light using a KrF excimer laser having a numerical aperture of 0.45. Then, a post-exposure baking (PEB) was performed at a temperature of about 140° C. for about 90 seconds.

The resultant material was developed using 2.38 weight percent (wt %) of TMAH with IPA(isopropanol)(25 wt %) solution for about 60 seconds. A clean line and a very fine space pattern having a width of 0.40 μm was obtained using an exposure dose of about 25 mJ/cm².

EXAMPLE 8

Photolithographic Performance 1.0 g of the terpolymer synthesized in Example 6, (wherein r/(r+s+t)=0.3, s/(r+s+t)=0.5, t/(r+s+t)=0.2 and weight-average molecular weight=13,500), and 0.02 g of triphenyl sulfonium triflate as a photoacid generator, were completely dissolved in 6.0 g of PGMEA. The solution was filtered using a 0.2 μm membrane filter to obtain a photoresist composition. Then, the photoresist composition was applied to a silicon wafer treated with HMDS to form a photoresist coating film having a thickness of about 0.5 μm on the wafer.

The wafer having the coated photoresist film thereon was pre-baked at a temperature of about 140° C. for about 90 seconds and exposed to light using a KrF excimer laser having a numerical aperture of 0.45. Then, a post-exposure bake was performed at a temperature of about 140° C. for about 90 seconds.

The resultant material was developed using 2.38 wt % of TMAH solution for about 60 seconds. A clean line and a very fine space pattern having a width of 0.40 μm was obtained using an exposure dose of about 16 mJ/cm².

EXAMPLE 9

Photolithographic Performance 1.0 g of the terpolymer synthesized in Example 6, (wherein r/(r+s+t)=0.3, s/(r+s+t)=0.5, t/(r+s+t)=0.2 and weight-average molecular weight=13,500), and 0.01 g of triphenyl sulfonium triflate and N-hydroxysuccinimide triflate as photoacid generators, were completely dissolved in 6.0 g of PGMEA. The solution was then filtered using a 0.2 μm membrane filter to obtain a resist composition. Next, the resist composition was applied to a silicon wafer treated with HMDS to form a coating film having a thickness of about 0.5 μm.

The wafer having the coated photoresist film was prebaked at a temperature of about 140° C. for about 90 seconds, and exposed to light using a KrF excimer laser having a numerical aperture of 0.45. Then, a post-exposure bake was performed at a temperature of about 140° C. for about 90 seconds.

The resultant material was developed using 2.38 wt % of TMAH solution for about 60 seconds. A clean line and a very fine space pattern having a width of 0.40 μm was obtained using an exposure dose of about 23 mJ/cm².

EXAMPLE 10

Photolithographic Performance 1.0 g of the terpolymer synthesized in Example 6, (wherein r/(r+s+t)=0.3, s/(r+s+t)=0.5, t/(r+s+t)=0.2 and weight-average molecular weight=13,500), and 0.02 g of triphenyl sulfonium triflate as a photoacid generator, were completely dissolved in 6.0 g of PGMEA. 2 mg of the organic base triisobutylamine was completely dissolved in this solution, and the resultant solution was filtered using a 0.2 μm membrane filter to obtain a resist composition. The resist composition was then applied to a silicon wafer treated with HMDS to form a coating film having a thickness of about 0.5 μm.

The wafer having the coating film thereon was pre-baked at a temperature of about 140° C. for about 90 seconds and exposed to light using a ArF excimer laser having a numerical aperture of 0.60. Then, a post-exposure bake was performed at a temperature of about 140° C. for about 90 seconds.

The resultant material was developed using 2.38 wt % of TMAH solution for about 60 seconds. A clean line and a very fine space pattern having a width of 0.30 μm was obtained using an exposure dose of about 14 mJ/cm².

As described above, the photosensitive polymers of the present invention have a backbone with a cyclic structure containing an alicyclic compound which improves the dry etching resistance of the polymer, and makes photoresist compositions containing the polymer resistant to dry etching.

Moreover, the acrylate polymers of the present invention provide a high transmittance. In other words, the photoresist film does not absorb light at 193 nm and thus is capable of being developed by an Ar excimer laser. The photoresist film composed of the photoresist composition according to the present invention is transparent at 193 nm throughout the entire film thickness, and accordingly, a photoresist pattern having substantially perpendicular (i.e., non-slanted) side walls can be obtained.

The photosensitive polymers are obtained by copolymerizing ether dimers of hydroxymethyl acrylate derivatives. Excellent photolithographic performance is obtained using photoresist compositions that contain the photosensitive polymer of the present invention. These new photoresist compositions produce a sharp resist pattern when exposed using an ArF excimer laser. The photoresist compositions according to the present invention are therefore useful in the manufacture of next generation semiconductor devices.

Although preferred embodiments of the present invention have been described in detail hereinabove, many variations and/or modifications of the basic inventive concepts herein taught will appear to those skilled in the art. All such variations and/or modifications fall within the spirit and scope of the present invention as defined in the appended claims.

What is claimed is:

1. A photosensitive polymer for use in a chemically amplified photoresist, which polymer is represented by the following chemical formula:

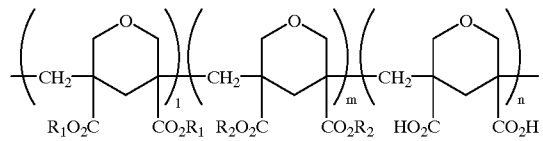

wherein $R_1$ is a $C_1$ to $C_{20}$ aliphatic hydrocarbon; $R_2$ is selected from the group comprising t-butyl, tetrahydropyranyl and 1-alkoxyethyl groups; l, m, and n are integers, and wherein $l/(l+m+n)=0.1-0.5$, $m/(l+m+n)=0.1-0.7$, and $n/(l+m+n)=0.0-0.4$.

2. The photosensitive polymer according to claim 1, wherein the polymer has a weight-average molecular weight of from 3,000 to 100,000.

3. The photosensitive polymer according to claim 1, wherein $R_1$ is a $C_7$ to $C_{20}$ alicyclic aliphatic hydrocarbon.

4. A photoresist composition comprising:
  (a) a photosensitive polymer represented by the following chemical formula:

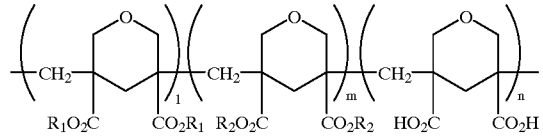

wherein $R_1$ is a $C_1$ to $C_{20}$ aliphatic hydrocarbon; $R_2$ is selected from the group comprising t-butyl, tetrahydropyranyl and 1-alkoxyethyl groups;
  l, m, and n are integers, and wherein $l/(l+m+n)=0.1-0.5$, $m/(l+m+n)=0.1-0.7$, and $n/(l+m+n)=0.0-0.4$; and
  (b) a photoacid generator (PAG).

5. The photoresist composition according to claim 4, wherein the polymer has a weight-average molecular weight of from about 3,000 to 100,000.

6. The photoresist composition according to claim 4, wherein $R_1$ is a $C_7$ to $C_{20}$ alicyclic aliphatic hydrocarbon.

7. The photoresist composition according to claim 4, comprising from 1 weight percent to 15 weight percent of the photoacid generator (PAG) based on the weight of the polymer.

8. The photoresist composition according to claim 4, wherein the photoacid generator (PAG) is one selected from the group comprising triarylsulfonium salts, diaryliodonium salts, sulfonates, and mixtures thereof.

9. The photoresist composition according to claim 4, wherein the photoacid generator (PAG) is one selected from the group comprising triphenylsulfonium triflate, triphenylsulfonium antimonate, diphenyliodonium triflate, diphenyliodonium antimonate, methoxydiphenyliodonium triflate, di-t-butyidiphenyliodonium triflate, 2,6-dinitrobenzyl sulfonates, pyrogallol tris(alkylsulfonates), N-hydroxy succinimide triflate, and mixtures thereof.

10. The photoresist composition according to claim 4, further comprising an organic base.

11. The photoresist composition according to claim 10, wherein the organic base comprises from 0.01 weight percent to 2.0 weight percent based on the weight of the polymer.

12. The photoresist composition according to claim 10, wherein the organic base is one selected from the group comprising triethyl amine, triisobutylamine, triisooctylamine, and mixtures thereof.

13. The photoresist composition according to claim 10, wherein the organic base is one selected from the group comprising diethanol amine, triethanol amine, and mixtures thereof.

* * * * *